United States Patent [19]

Jung

[11] Patent Number: 5,281,967
[45] Date of Patent: Jan. 25, 1994

[54] DATA COMPRESSION/DECOMPRESSION METHOD AND APPARATUS

[76] Inventor: Robert K. Jung, 2606 Village Rd. West, Norwood, Mass. 02062

[21] Appl. No.: 827,634

[22] Filed: Jan. 29, 1992

Related U.S. Application Data

[63] Continuation-in-part of Ser. No. 755,027, Sep. 4, 1991, Pat. No. 5,140,321.

[51] Int. Cl.$^5$ ............................................. H03M 7/34
[52] U.S. Cl. ......................................... 341/55; 341/51
[58] Field of Search ...................... 341/51, 55, 65, 67, 341/95, 106

[56] References Cited

U.S. PATENT DOCUMENTS

| | | | |
|---|---|---|---|
| 4,464,650 | 8/1984 | Eastman et al. | 340/347 DD |
| 4,558,302 | 12/1985 | Welch | 341/51 |
| 4,597,057 | 6/1986 | Snow | 341/106 X |
| 4,814,746 | 3/1989 | Miller et al. | 341/95 |
| 5,049,881 | 9/1991 | Gibson et al. | 341/95 |
| 5,051,745 | 9/1991 | Katz | 341/51 |
| 5,126,739 | 6/1992 | Whiting et al. | 341/106 |
| 5,140,321 | 8/1992 | Jung | 341/55 |
| 5,146,221 | 9/1992 | Whiting et al. | 341/67 |
| 5,150,119 | 9/1992 | Yoshida et al. | 341/51 |

FOREIGN PATENT DOCUMENTS

PCTGB8900-752 7/1989 United Kingdom .

OTHER PUBLICATIONS

Bell et al., "Text Compression", Prentice Hall, pp. 239–243.
Brent, "A Linear Algorithm for Data Compression", The Australian Computer Journal, vol. 19, No. 2, May 1987, pp.
Ziv et al., "Compression of Individual Sequences via Variable-Rate Coding", IEEE Transactions on Information Theory, vol. IT-24, No. 5, Sep. 1978, pp. 530–536.
Ziv et al., "A Universal Algorithm for Sequential Data Compression", IEEE Transactions on Information Theory, vol. IT-23, No. 3, May, 1977, pp. 337–343.

*Primary Examiner*—Marc S. Hoff
*Attorney, Agent, or Firm*—Wolf, Greenfield & Sacks

[57] ABSTRACT

A method and apparatus for compressing digital data uses data which has been previously compressed as a dictionary of substrings which may be replaced in an input data stream. The method and apparatus uses a hash table to take advantage of principles of locality and probability to solve the maximal matching substring problem inherent in this type of compressing apparatus, most of the time. The hash table consists of first-in, first-out (FIFO) collision chains of fixed, uniform numbers of pointers to substrings of data already compressed which potentially match an input substring. A link list is maintained for linking pointers to corresponding potentially matching strings. A companion decompressing method and apparatus receives compressed data from the compressing apparatus and expand that data back to its original form.

22 Claims, 14 Drawing Sheets

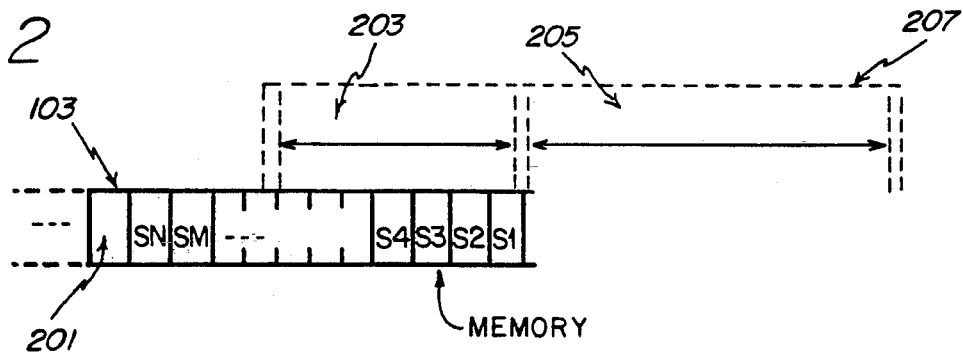
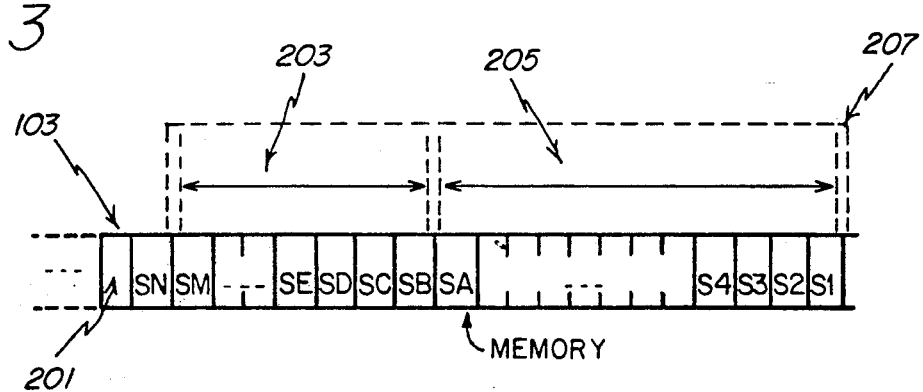
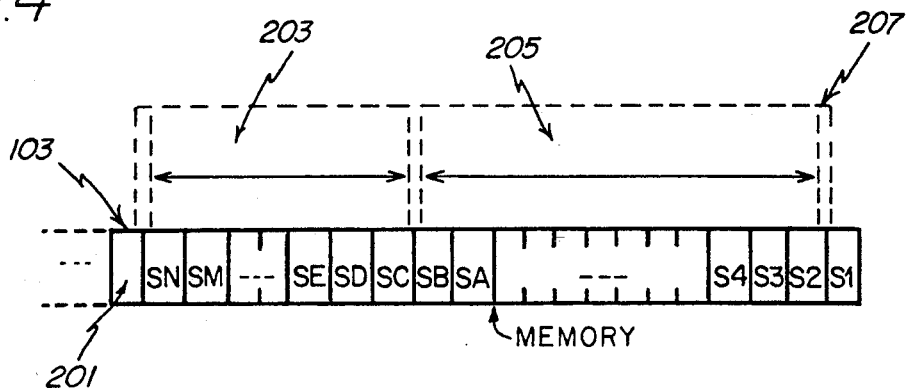

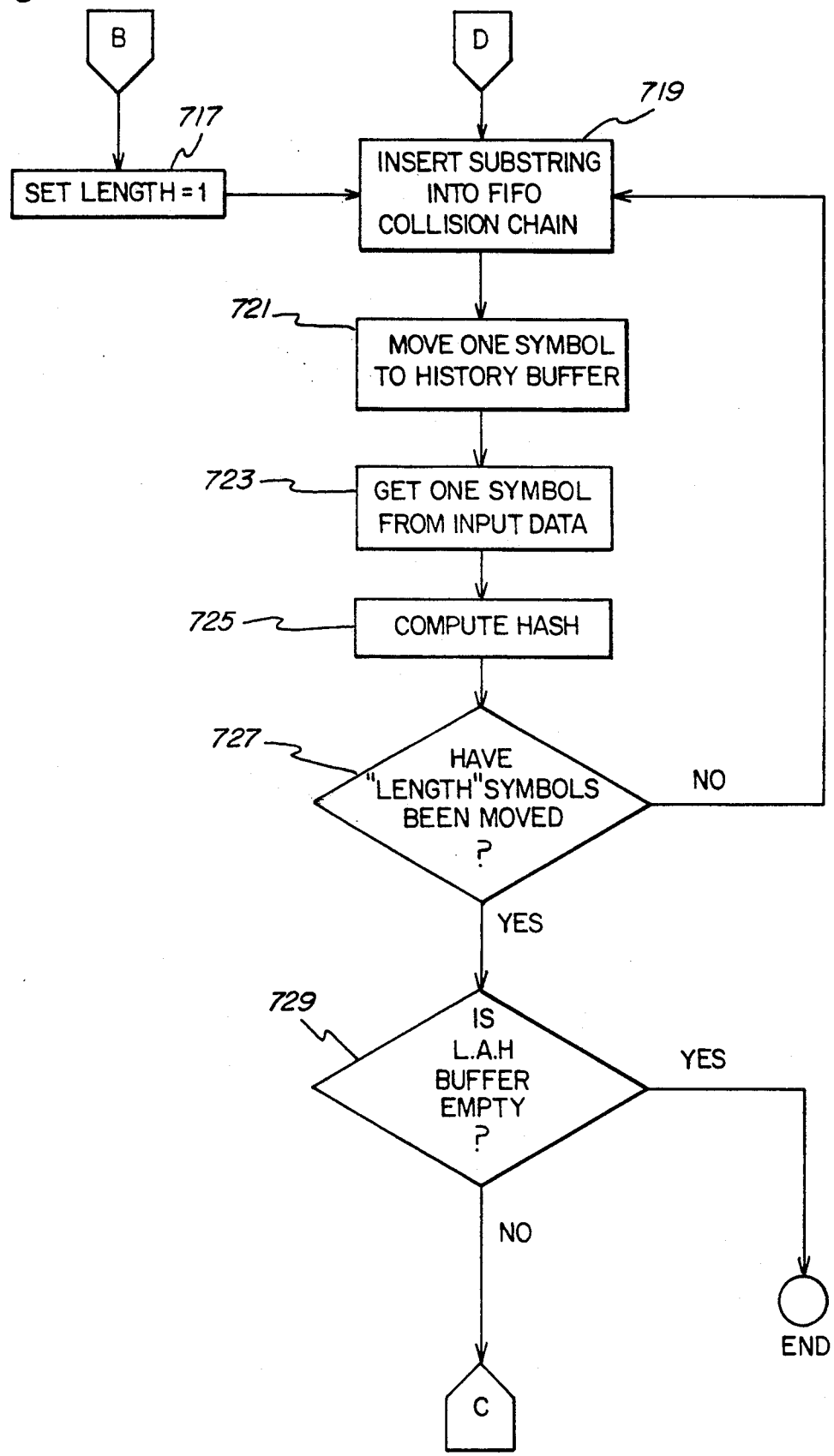

DATA COMPRESSION/DECOMPRESSION METHOD AND APPARATUS

DATA COMPRESSION/DECOMPRESSION METHOD AND APPARATUS

The present application is a continuation in-part application of application Ser. No. 07/755,027 filed Sep. 4, 1991 now issued as U.S. Pat. No. 5,140,321.

BACKGROUND OF THE INVENTION

1. Field of the Invention

The present invention relates generally to data processing and more particularly to digital data compression.

2. Description of Prior Art

Information processing systems and data transmission systems frequently need to store large amounts of digital data in a mass memory device or to transfer large amounts of digital data using a resource which may only carry a limited amount of data at a time, such as a communications channel. Therefore, approaches have been developed to increase the amount of data that can be stored in memory and to increase the information carrying capacity of capacity-limited resources. Most conventional approaches to realizing such increases are costly in terms of equipment or monetary expense, because they require the installation of additional resources or the physical improvement of existing resources. Data compression, in contrast with other conventional approaches, provides such increases without incurring large costs. In particular, it does not require the installation of additional resources or the physical improvement of existing resources.

Data compression methods and apparatuses remove redundancy from a data stream, while still preserving the information content. The data compression methods and apparatuses which are of the greatest interest are those which are fully reversible, such that an original data stream may be reconstructed from compressed data without any loss of information content. Techniques, such as filtering, which are not fully reversible, are sometimes suitable for compressing visual images or sound data. They are, nevertheless, not suitable for compression of program image files, textual report files and the like, because the information content of such files must be preserved exactly.

There are two major goals in digital data compression. The first goal is to maximize compression by using the fewest possible bits to represent a given quantity of input data. The second goal is to minimize the resources required to perform compression and decompression. The second goal encompasses such objectives as minimizing computation time and minimizing the amount of memory required to compress and decompress the data. Data compression methods of the prior art typically achieve only one of these goals.

There are two major families of data compression methods currently in use. Both of these families are derived from methods developed by Ziv and Lempel. The first family of methods is based on a method of Ziv which will be referred to hereinafter as LZ78. This method is described in detail in Ziv et al., "Compression of Individual Sequences Via Variable-Rate Coding," *IEEE Transactions on Information Theory*, IT-24-5, September, 1978, pp 530-537. The second family of methods is based on another method of Ziv which will be referred to hereinafter as LZ77. This method is described in detail in Ziv et al., "A Universal Algorithm for Sequential Data Compression," *IEEE Transactions on Information Theory*, IT-23-3, May, 1977, pp 337-343.

For the purpose of conveniently manipulating digital data, the data is usually divided into symbols, such as binary words, bytes or ASCII characters. LZ78 and LZ77 compress an input data stream of symbols by dividing the input data into substrings of symbols, and then replacing the substrings with short codes representing those substrings. So that a compressed data stream may be decompressed, a dictionary equating each substring with a code which replaces it is built as substrings are replaced. The division of the input data stream into substrings is performed so that each substring is the longest string for which there is an identical substring in the input data stream.

LZ78-based methods build the dictionary from substrings for which matches have been found. The codes used in the output data to represent substrings of the input data are simply indexes into this dictionary. As noted above, substrings selected for placement in the dictionary are the longest substrings for which a matching substring may be found earlier in the input data. The most popular derivative of LZ78 is Lempel-Ziv-Welch, (hereinafter referred to as LZW) which is described in U.S. Pat. No. 4,558,302 issued to Welch on Dec. 10, 1985.

LZ78-based methods, including LZW, are very popular because of their high speed of compression. However, the primary disadvantage of LZ78-based methods is that they require large amounts of memory to hold the input data and the dictionary. Solutions to these problems with LZ78-based methods are suggested by Miller, U.S. Pat. No. 4,814,740 and Clark et al., International Patent Application PCT/GB89/00752. These references concern methods for limiting the complexity of the tree structures which are often used to find the longest matching substrings in the input data.

In contrast with building an independent dictionary on the basis of matches found, LZ77-based methods use the previously compressed input data as the dictionary. Therefore, a buffer memory is reserved for retaining some portion of the previously compressed data which will be used as the dictionary. In these methods, the codes which replace the substrings are pointers to matching substrings held in the buffer. As in LZ78-based methods, the replacement codes represent the longest available previous occurrence of a matching substring. The contents of the buffer memory determine availability in this context.

The pointers which replace substrings of the input data each comprise an ordered pair of values representing an offset and a length. The offset indicates the number of symbols between the substring replaced by the pointer and the substring to which the pointer points, while the length indicates the number of symbols in the substring replaced by the pointer.

Since any embodiment of an LZ77-based method must have a finite amount of memory, the range of values representable by the offset and length is limited. Thus, LZ77-based methods differ from each other in two parameters, N, the maximum offset distance a pointer may represent, and F, the maximum length of a substring that may be replaced by a pointer. The parameter N defines a window of available input data which is used as the dictionary. In particular, the dictionary contains only the input data which is within the maximum offset N of the substring currently being compressed or decompressed. The contents of the dictionary are continuously replenished from the input data as data is manipulated.

A derivative of the LZ77 algorithm was suggested by Storer and Szymanski. Their observation was that a pointer is sometimes longer than the substring it replaces. Thus, their suggestion, hereinafter denoted as LZSS, was to use literal symbols taken directly from the input stream whenever a pointer would take up more space than the substring it replaces. A flag bit is then added to each pointer and symbol to distinguish pointers and symbols each from the other.

LZSS-based methods provide excellent data compression, generally better than LZW, but also require significant computation time. This is caused by the well known, maximal matching substring problem, which is at the heart of LZ77-based compressors. In the context of LZ77-based data compressors, this problem calls for finding the longest substring in the dictionary, which matches the input data stream.

There have been many attempts to solve this problem, including for example, that of Brent as taught in "A Linear Algorithm for Data Compression," *The Australian Computer Journal*, Volume 19, Number 2, May 1987. However, the solution of Brent fails to achieve the best possible results of fast compression with a high compression ratio. Brent uses a hashing technique to quickly locate potential matches in the history buffer. However, Brent's method operates by hashing most of the substrings of the dictionary, in order to find the maximal matching substring all of the time. This is both time-consuming and memory intensive, as the hash table must be capable of pointing anywhere in the history buffer.

Furthermore, practical embodiments of Brent's method use a history buffer having a finite size. In such an embodiment, Brent's method will not always find the most recent, maximal match.

Thus, a general object of the present invention is to provide a method and apparatus for data compression that yields excellent compression for a variety of input data types including executable run files, report files, and document files while using a minimum of computation time.

Another object of the present invention is to provide a method and apparatus for data compression that uses a minimal amount of memory.

Yet another object of the present invention is to provide a method and apparatus for data compression that achieves the compression by means of an efficient solution to the maximal matching substring problem.

SUMMARY OF THE INVENTION

In order to achieve the above and other objects, the data system for compressing digital input data according to the present invention operates on input data which is divisible into symbols. Those symbols may then be grouped together into sequences of symbols, which may alternatively be referred to as substrings.

The system of the present invention uses an approach based on locality and probability to solve the maximal matching substring problem of LZ77-based compressors most of the time rather than attempting to solve it all of the time. The approach is based on the observation that the maximal matching substring for an input substring is frequently a substring which is nearby in the data stream. Thus, in most instances, the longest substring which matches an input substring will be found by looking only at the most recent potential matches. In those instances when the maximal matching substring problem is not solved, a near maximal matching substring will often have been found, at a considerable saving of time, while forfeiting only a fraction of the compression which would be gained by finding the maximal matching substring.

A system for processing digital input data, according to the present invention, in which the input data is divisible into strings of bits representing symbols, comprises a memory for holding first and second strings of symbols from the input data. The first string has a prefix substring of a fixed length. The system also comprises means for receiving the prefix substring and computing a first string hash value therefrom. The system further comprises a hash table for receiving the first string hash value and providing pointers to locations in the second string with the same hash value. An alternate embodiment of the present invention provides a single dimensional hash table and a link list. The link list includes a link between each pointer which points to a location having an associated second string substring of the fixed length with a same second string hash value. The system further comprises means for receiving the first and second strings of symbols from the memory. The system further comprises means for determining the longest second string substring match of a first string substring including the first string prefix substring. This means for determining includes means for comparing the first string substring with a selected limited number of second string substrings; the second strings have a prefix of the same length as the first string prefix substring. The prefixes of the first and second strings compared have the same hash value. The system further comprises means for generating compressed output data responsive to the means for determining.

In an alternate embodiment of the present invention the means for determining further includes means for finding a second string substring match of a certain length pointed to by a first pointer and means for performing a symbol comparison of the first string substring with a second string substring pointed to by a second pointer. This means for performing begins with a symbol being at least one symbol beyond the certain length.

The invention will be more fully understood from the following description, when read in conjunction with the accompanying drawing, in which like numerals identify like elements.

BRIEF DESCRIPTION OF THE DRAWING

FIG. 2 is a memory map illustrating the contents of memory at a time when input data has been received, but processing had not yet begun.

FIG. 3 is a memory map illustrating the contents of the memory of FIG. 2 after symbols S1 through SA have been processed.

FIG. 4 is a memory map illustrating the contents of the memory of FIG. 3 after an additional symbol SB has been processed.

FIGS. 7A, 7B, and 7C are a flow chart of a compression method according to the present invention.

DETAILED DESCRIPTION

Figure 1:
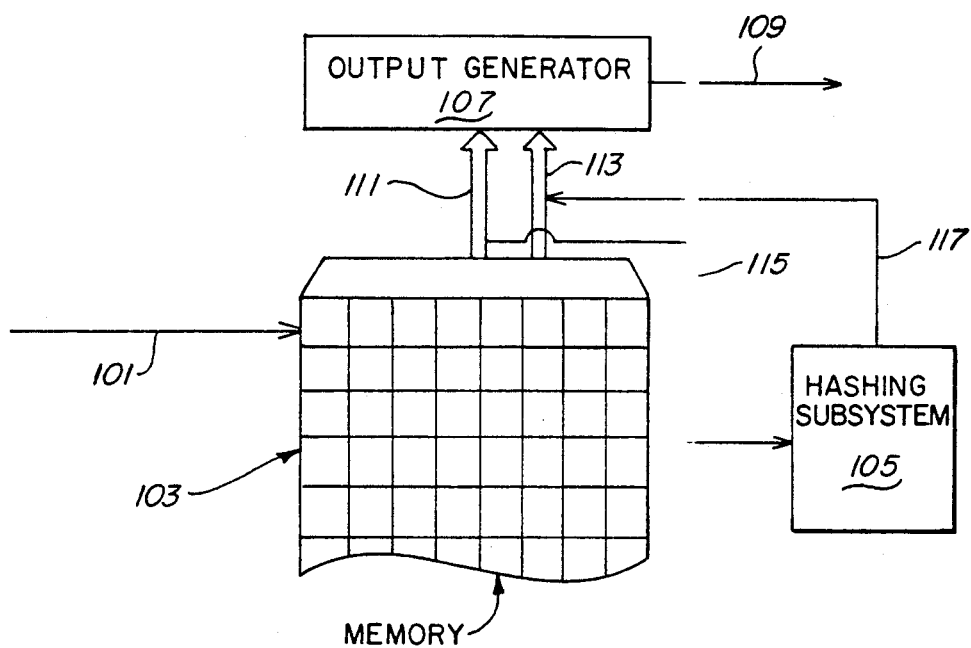
FIG. 1 is a block diagram of a data compression system according to the present invention.

Embodiments of the present invention are generally and initially described with reference to FIG. 1. An input data stream 101 comprising symbols, such as ASCII characters, which are each a fixed number of bits is received into a memory 103. In the preferred embodiment, memory 103 is a random access memory (RAM) of a general-purpose, data processing system. Input data stream 101 is processed by output generator 107 to produce a compressed output data stream 109. The input data stream 101, however, remains unchanged in memory 103 throughout processing. Hashing subsystem 105 facilitates processing as described in greater detail with reference to FIG. 5, below. Processing of the input data stream 101 will be more readily understood in view of the arrangement of input data stream 101 in memory 103 which is now discussed in more detail.

Data in the input data stream 101 is serially stored in memory 103 as a linear sequence of symbols in consecutive memory locations as illustrated in FIGS. 2, 3 and 4. In these figures, each box (e.g. box 201) represents a memory location for storing a symbol. The stored symbols are denoted by the reference characters S1, S2, S3, S4, SA, SB, SC, SD, SE, SM, and SN. Sequences of symbols occupying adjacent memory locations constitute substrings of symbols. For example, the sequence of symbols (SA, SB, SC, SD) form a substring.

FIG. 2, illustrates the state of the memory 103 when input data stream 101 (FIG. 1) has been stored in the memory 103 (FIG. 2) as a linear sequence of symbols in consecutive memory locations, but no data in the input data stream has yet been compressed. The memory 103 includes a lookahead buffer 203 which is a portion of memory 103 wherefrom lookahead substring 111 is obtained. For example, in FIG. 3 the substring in lookahead buffer 203 consisting of symbols SB through SM, form lookahead substring 111 (FIG. 1). As processing progresses, symbols beginning with S1 are compressed and moved out of lookahead buffer 203 into a second region of memory known as a history buffer 205. The symbols in history buffer 205 are those from which history substring 113 (FIG. 1) are drawn. The role of such lookahead substrings 111 and history substrings 113 in processing of input data will be more apparent in the discussion below. The state of memory 103 after symbols S1 through SA have been compressed is illustrated in FIG. 3. Since all substrings used by the data compressor of the present invention are obtained from lookahead buffer 203 or history buffer 205, these buffers when taken together form a processing window 207.

The symbols in the lookahead buffer are processed sequentially beginning with those symbols in the rightmost positions in the lookahead buffer 203. Thus, symbol SB would be the first symbol processed in FIG. 3. When the symbol SB of FIG. 3 is processed, the resultant state of memory is as illustrated in FIG. 4. Symbol SN, which was stored in FIG. 3 just outside of lookahead buffer 203, is moved inside lookahead buffer 203 in FIG. 4, while the oldest symbol S1 in history buffer 205, is outside of processing window 207. The movement of symbols in and out of the buffers 205 and 207 need not be accomplished by physically moving symbols among different memory locations in memory 103; rather, it may be accomplished, as in the preferred embodiment, by sliding the logical construct of the processing window 207 through memory locations in memory 103.

Resuming the description of FIG. 1, during processing, output sequence generator 107 receives lookahead substring 111 and history substring 113 from the respective buffers 203 and 205. Output sequence generator 107 compares lookahead substrings 111 and history substrings 113 to find matching substrings which may be compressed by removing redundant data.

In one embodiment, memory 103, hashing subsystem 105 and output generator 107 are a combination of generalized hardware comprising the general-purpose, data processing system and a software program running in the general-purpose, data processing system. However, as will be evident to those skilled in the art, these elements may be equally well realized in alternative embodiments, such as special purpose hardware. For the purpose of further discussion, the operation of the system of FIG. 1 will be considered in two parts: operation of hashing subsystem 105 in connection with memory 103 and operation of output generator 107.

Figure 5:
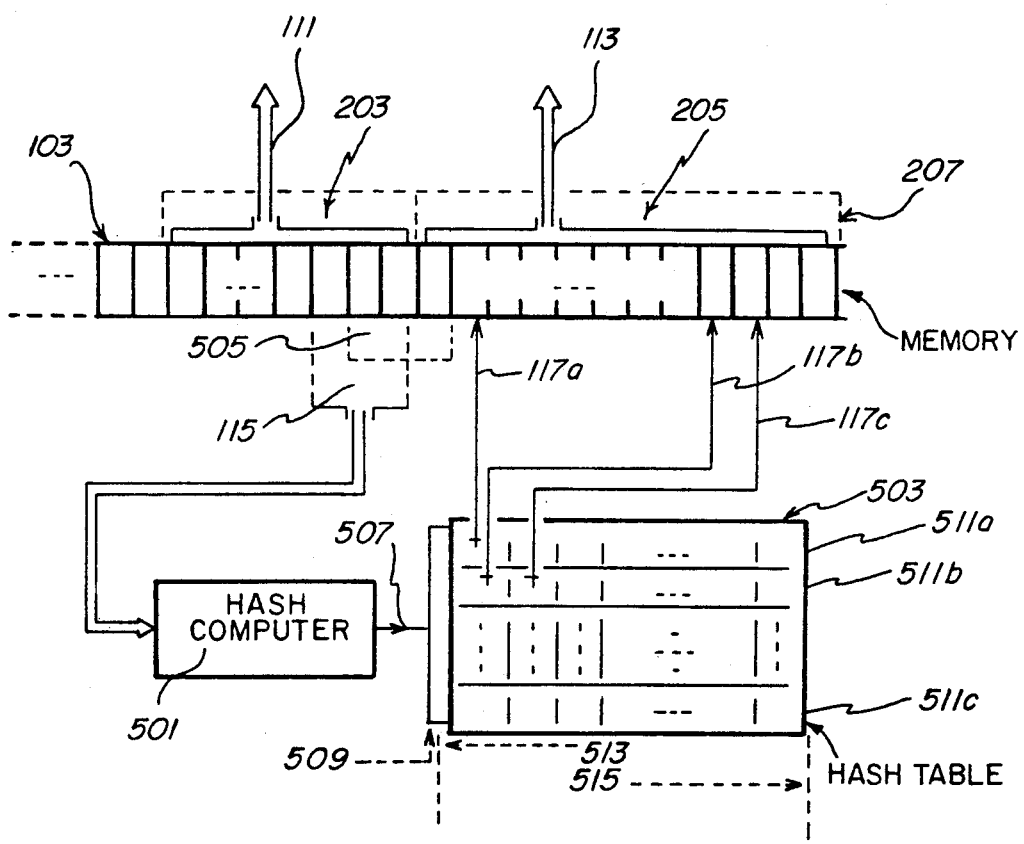
FIG. 5 is a detailed block diagram of a hashing subsystem in a preferred embodiment of the resent invention.

The structure and function of hashing subsystem 105 in connection with memory 103 is described with reference to FIG. 5. According to the present invention, hash computer 501 operates on prefix substrings having a fixed, uniform length, less than the length of lookahead substring 111. In a first embodiment, a prefix substring 115 comprising the first three symbols of lookahead substring 111 is forwarded to a hash computer 501 from the lookahead buffer 203. Hash value 507 is used as an index 509 into hash table 503, for selecting a pointer 117 to history substring 113. Pointer 117 may be one of pointers 117a, 117b, or 117c, for example. Thus, history substring 113 is a substring 113 selected from those substrings to which pointers 117 point. Now, the operation of hashing subsystem 105 is described in greater detail.

The hash computer 501 performs a hashing function on prefix substring 115. Hashing functions are well known in the art. In this embodiment, the hashing function performs a bit-wise, logical exclusive or (XOR) of the symbols comprising the prefix substring 115. A bit-wise XOR performs the logical function XOR on corresponding bits of two input bit streams. Logical XOR is a function of two input bits which returns an asserted value if only one of the two input bits is asserted, but returns a deasserted value otherwise. This function is chosen for the preferred embodiment because it may be computed rapidly and results in a modest hash table size. Nevertheless, those skilled in the art will recognize that other selection criteria are possible, as are other suitable hashing functions. Prefix substring 115 is derived from an immediately preceding prefix substring 505. In particular, it is derived by dropping a first symbol of preceding prefix substring 505 and adding on a new last symbol.

Thus, the hashing function may be performed as follows:

(1) obtain a hash value computed earlier for previous prefix substring 505;
(2) bit wise XOR the previous hash value with the dropped first symbol;
(3) bit-wise XOR the result of operation (2) with the new last symbol.

The result is the desired hash value 507 of prefix substring 115. Hash value 507 is used to locate a matching hash table index 509 for selecting one of the entries of hash table 503.

Hashing functions map an input, such as prefix substring 115, into a more limited number of hash values 507. Thus, for some different choices of prefix substring 115, the same hash value 507 may be obtained. Furthermore, since very short prefix substrings 115 are used in the preferred embodiment, multiple, identical prefix substrings 115 may exist within history buffer 205. Multiple inputs mapping into a single hash value create hash "collisions." In order to cope with these "collisions," hash table 503 has the structure of a two-dimensional array. By including a second dimension in the hash table 503 of the present invention, lists of "collisions" may be stored.

Since pointers 117 may express only a finite range of locations in memory 103, it is desirable to hold only the most recent pointers 117 in each entry. Thus each entry, or row of the array, is a first in, first-out (FIFO) collision chain, such as 511a, 511b and 511c for example. FIFO collision chains 511 consist of a fixed, uniform number of pointers 117. Since collision chains 511 are organized in a FIFO manner, newer entries are to be found at the trailing end 513 of the chains while older entries are found at the leading end 515 of the chains.

Although hash table 503 has an array structure in the preferred embodiment, the array structure of the data of hash table 503 is given by way of illustration only. Hash table 503 and collision chains 511 may assume other structures, as will be evident to those skilled in the art.

Thus, in response to the input of a prefix substring 115, hash computer 501 and hash table 503 cooperate to produce a collision chain 511 having a fixed number of pointers 117. Each pointer 117 in the selected collision chain 511 is provided with a history substring 113. As described in connection with FIG. 1, lookahead substring 111 and each of the history substrings 113 are forwarded to output generator 107.

Figure 6:
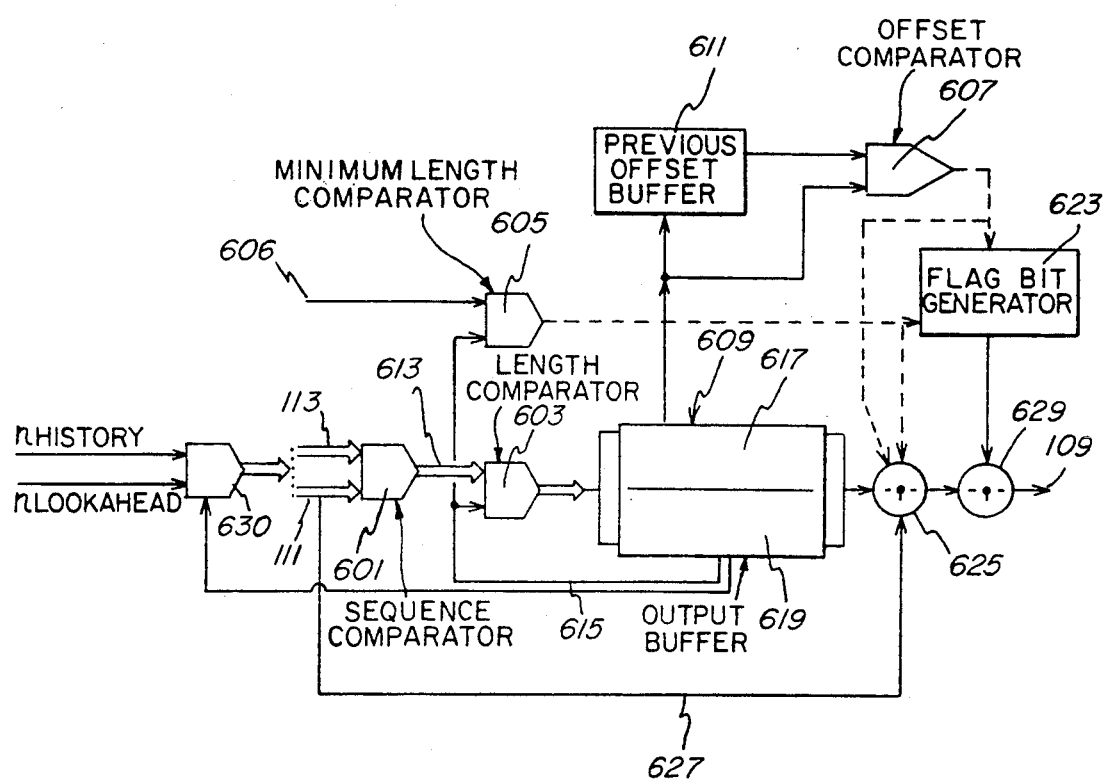
FIG. 6 is a detailed block diagram of an output sequence generation in a preferred embodiment of the present invention.

Output generator 107 is now described with reference to FIG. 6. Lookahead substring 111 and history substrings 113, as described in connection with FIG. 5, are received by sequence comparator 601. Sequence comparator 601 determines the number of sequential symbols in each history substring 113 which match corresponding symbols in lookahead substring 111, and beginning with the symbols corresponding to prefix substring 115. The number of symbols in history substring 113 which match corresponding symbols in lookahead substring 111 is defined to be the length 613 of history substring 113. Thus, sequence comparator 601 determines a length 613 of history substring 113. Length comparator 603 receives length 613 as one input. A second input to length comparator 603 denotes the longest match found thus far 615. This second length value 615 is a value that has been previously stored by length comparator 603 in output buffer 609. When length 613 exceeds the length 615, length comparator 603 stores a new offset 617 and length 619 in output buffer 609. The offset 617 and length 619 point to a location in memory 103 wherein history substring 113 begins.

In an alternate embodiment of the present invention, initial symbol comparator 630 compares the symbol in history substring 113 with the symbol in look ahead substring 111, which is one symbol beyond the longest length match found thus far. These symbols are noted as n history and n lookahead in FIG. 6. Once a first history substring match is found the length 619 is stored in output buffer 609. Initial symbol comparator 630 then receives this length and compares the symbol in the next history substring potential match with the symbol in the lookahead substring which is one symbol beyond this length. If a match is found with this symbol, then comparator 601 will proceed sequentially as described above until a nonmatching symbol is found starting with the first symbol of each string. If a match is not found with this symbol then comparator 601 will be idle for the time being and a next potential history substring match will be retrieved. If a match is found with this symbol, comparator 601 will then back track to compare symbols skipped to see if all the symbols match. If all of the symbols match, then a greater length substring match is found. This is a time saving mechanism because if the initial symbol comparison does not yield a match, then there is no need to compare any of the other symbols to see if a longer length match is found. This alternate embodiment is described in more detail after the complete description of the first embodiment.

The operations heretofore outlined are repeated for all history substrings 113 which were provided along with the lookahead substring 111 a is further described below in connection with the flow charts of FIGS. 7A, 7B and 7C. Thus, when all history substrings 113 have been processed by output generator 107, output buffer 609 contains a pointer comprising an offset 617 and a length 619 denoting the longest history substring 113 found to match lookahead substring 111.

Minimum length comparator 605 and offset comparator 607 perform two additional tests on the contents of output buffer 609. The results of these tests determine output data stream 109. In the first test, minimum length comparator 605 compares the length 619 stored in output buffer 609 with minimum length 606. Minimum length 606 is a constant which is selected to ensure that a pointer consisting of offset 617 and length 619 is not output when length 619 denotes fewer bits than the number of bits occupied by the pointer. Minimum length comparator 605 controls flag bit generator 623 and output gate 625. Output gate 625 may selectively output the pointer in output buffer 609, the length 619 or the first literal symbol 627 of lookahead substring 111. Further, if output gate 625 outputs the pointer contained in output buffer 609, the offset 617 of that pointer is also transferred to previous offset buffer 611.

In the second test, prior to selecting the pointer contained in output buffer 609 for output, offset comparator 607 compares the contents of previous offset buffer 611 with the offset 617 currently in output buffer 609. The result of the comparison performed by offset comparator 607 is used to exert further control over flag bit generator 623 and output gate 625.

Finally, flag bits output by flag bit generator 623 are appended to the output of output gate 625 by gate 629, producing a compressed output data stream 109.

Further description of the operation of these elements for data compression according to the present invention is given herein below in connection with the flowcharts of FIGS. 7A, 7B and 7C. The steps of the method will be better understood when viewed along with the other Figures as well.

Processing is begun after receiving input data stream 101 into memory 103. First, in the present embodiment hash table 503 is initialized to an empty condition in step 701. Memory 103 and processing window 207 are placed in a condition as shown in FIG. 2. Next in step 703, a hash value is computed for a first prefix substring. These two steps 701 and 703 complete initialization of one method, however, other methods may use other initialization techniques, as will be readily apparent to those skilled in the art.

Alternate embodiments are contemplated, wherein the hash table 503 (FIG. 5) is not initialized. For example, one embodiment flushes history buffer 205 whenever history buffer 205 becomes full. However, hash table 503 requires no additional special attention. In such an embodiment, pointers 117 which point to unused locations in history buffer 205 are detected in an alternate step 709 (FIG. 7A), which performs the test "Is the location pointed to unused?" instead of the test indicated. Thus, if the result of the test is "Yes" then any history substring 113 obtained therefrom may be ignored. However, if the result of the test is "No" then a history substring 113 is obtained from the pointer 117 which points to a used location in history buffer 205, and processing occurs as described herein below.

Compression proceeds iteratively, beginning by indexing 705 into hash table 503. Indexing step 705 causes retrieval of a collision chain 511 from hash table 503. From that collision chain 511 a first pointer 117 is obtained 707. Since hash table 503 is presently empty, the test in step 709 for an empty pointer gives the result "Yes." Thus, processing proceeds to step 711 in FIG. 7B, which tests if length 619 is greater than minimum length 607. Since there is no previous data which has been operated upon, this test returns the value "No." Next, step 713 sets a flag bit to indicate that a literal symbol will be output, and clears a flag bit for indicating an offset alone will be output. Literal symbol 627 and the flag bits generated are then output in step 715. Thus, the first symbol S1 is processed, and the processing window 207 must be updated for future processing.

Figure 7A:
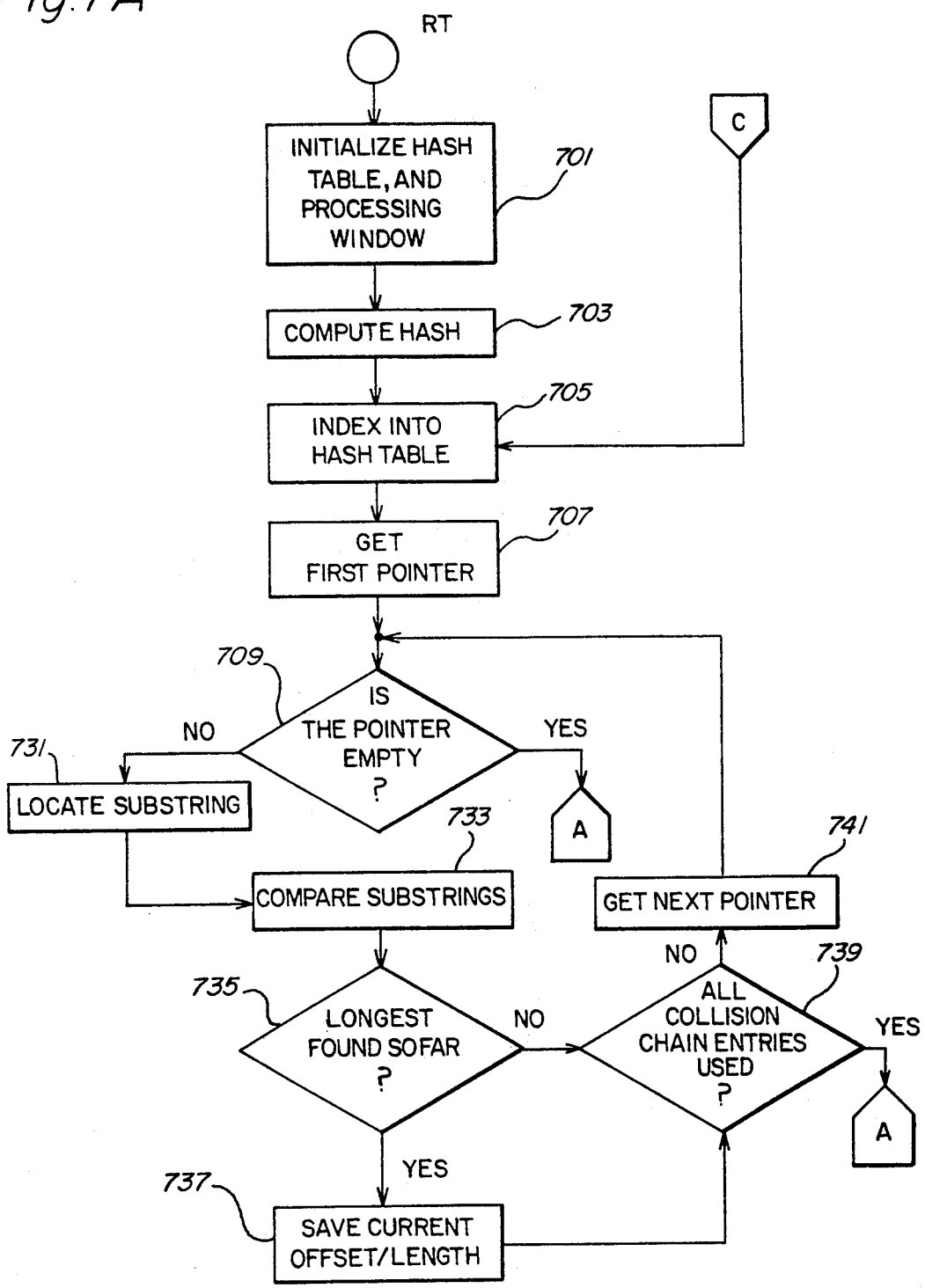
Figure 7B:
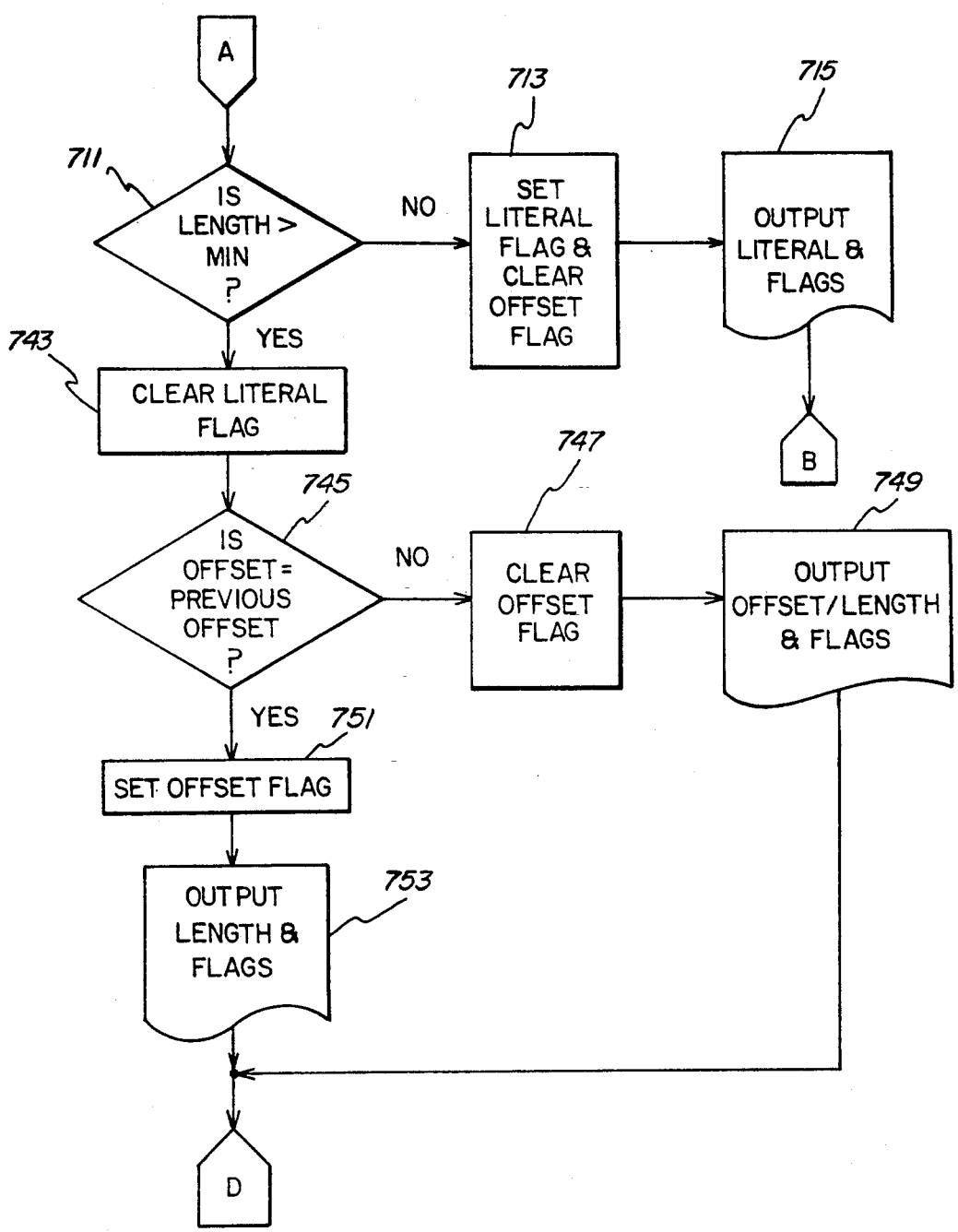

Subsequently, as shown in FIG. 7C the length of the substring output is set to one symbol in step 717. A pointer to the substring beginning with the symbol just processed is inserted in step 719 into the FIFO collision chain 511 which was obtained in step 705. One symbol is moved from the lookahead buffer to the history buffer 721, and one symbol is inserted in the lookahead buffer from the input data 723. These steps together comprise the movement of processing window 207 illustrated in FIGS. 3 and 4. Finally, a hash value is computed 725 for the prefix substring 115 of the resulting contents of the lookahead buffer 203. A test is performed to determine if all symbols processed have been moved to the history buffer (step 727), followed by another test which determines if all of input data stream 101 has been processed (step 729). All processed symbols having been moved, and lookahead buffer 203 not being empty, processing continues at step 705 in FIG. 7A.

When indexing step 705 obtains a collision chain 511 which has several pointers in it, the test performed in step 709 yields the answer, "No." Thus, in step 731 a substring is located which is pointed to in history buffer 205. This substring is a history substring 113, which is compared with lookahead substring 111 in step 733. In step 735, the result of the comparison of step 733 is checked to determine if the current history substring 113 is the longest such substring found so far. If it is, a pointer to history substring 113 is saved 737 in output buffer 609. Otherwise, a test is performed to determine if all entries of collision chain 511 have been checked step 739). If not, a next pointer 117 is obtained (step 741). Processing proceeds in this loop until either the next pointer 117 is empty, causing step 709 to give a "Yes" result, or all entries of a full collision chain 511 have been used and step 739 yields a "Yes" result. When a "Yes" result is obtained, the processing is transferred to the test 711 in FIG. 7B, which begins output processing.

On branch of output processing has been discussed in connection with processing the first symbol of input data stream 101. Now, the other two branches of output processing will be described. If length 619 exceeds the minimum length 607 the flag bit indicating a literal symbol is output is cleared (step 743). If length 617 is not equal to previous length 611, then the test of step 745 passes control to step 747 which clears the flag bit for indicating an offset only is output. In step 749 offset 617 and length 619 are placed, along with the flag bit, in output data stream 109. If test 745 determines that the present offset 619 is equal of the previous offset 611, then step 751 sets a flag bit for indicating that only a length value and the flag bits are to be output. Finally, the length and flags are output at step 753. Both of these output branches transfer control to step 719 in FIG. 7C, which has already been discussed.

Figure 8:
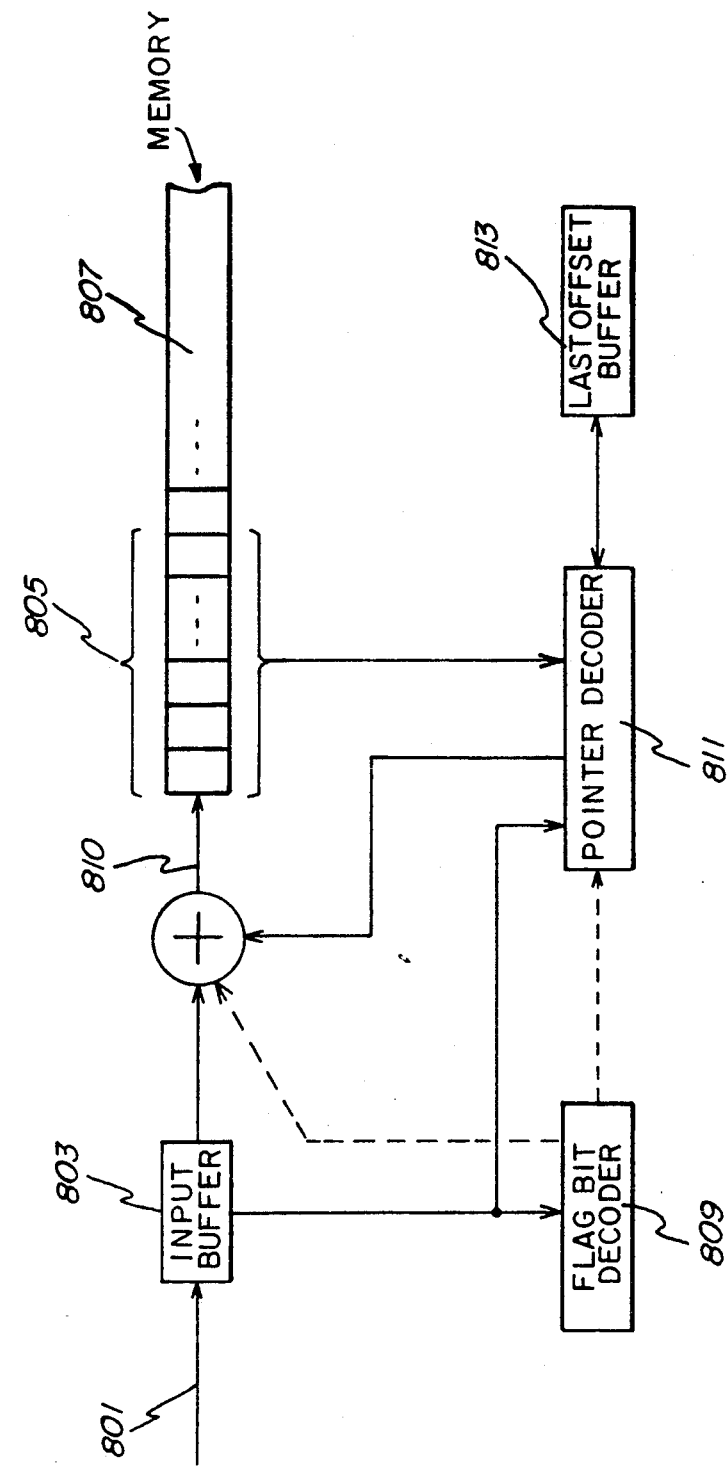
FIG. 8 is a block diagram of a decompressor according to the present invention.
Figure 9:
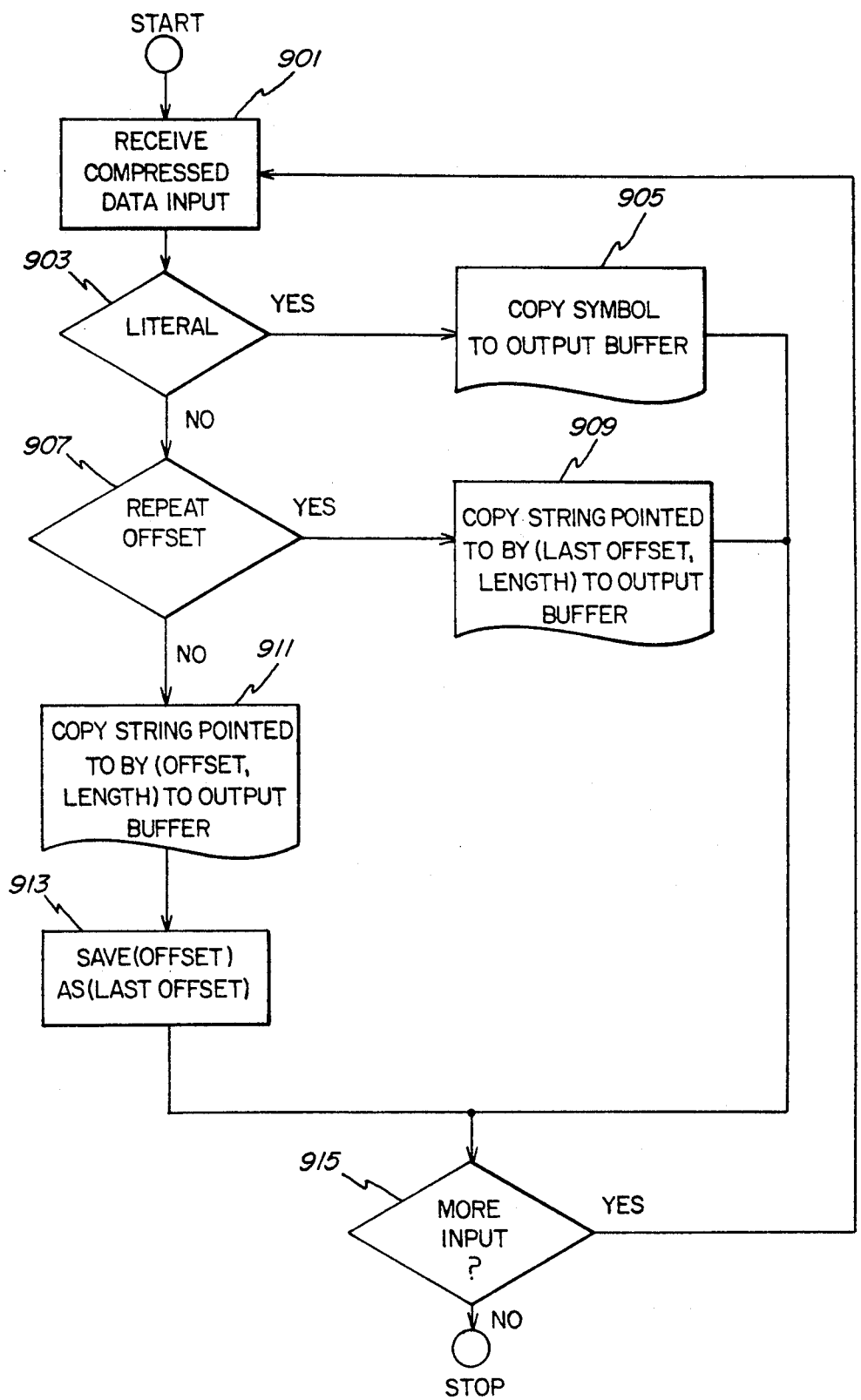
FIG. 9 is a flow chart of a decompression method for use with the apparatus of FIG. 8.

A preferred method and apparatus for decompressing data compressed by the method of the present invention is now described with reference to FIGS. 8 and 9. When compressed data 801 is received (step 901, FIG. 9) by the input buffer 803 of the decompressor of this preferred embodiment, it is expanded back to the original form of the input data by the following method, without losing or altering any of the information therein. The decompressor maintains an output buffer 805 in memory 807 containing recent, decompressed data. The flag bit decoder 809 simply checks the flag bit which differentiates literal symbols from pointers 903 (step 903, FIG. 9). If a literal symbol is indicated, it is provided as output (step 905, FIG. 9) in the output data stream 810. If a pointer is indicated (step 903, FIG. 9), the flag bit decoder 809 checks the flag bit which identifies repeated offset values (step 907, FIG. 9). If a repeated offset is indicated, the immediately previous offset and the length contained in the current pointer are used by the pointer decoder 811 to locate and copy (step 909, FIG. 9) a sequence of recently decompressed symbols within the buffer 805 in memory 807 to the output data stream 810. Otherwise, the offset and length contained in the current pointer are used to locate and copy (step 911, FIG. 9) a sequence within the buffer 805 in memory 807 to the output data stream 810. The last offset used is retained (step 913, FIG. 9) in last offset buffer 813 for possible use in a future repeat offset step 909. This process continues until all compressed data has been decompressed as determined at step 915, FIG. 9.

As a practical matter, in this preferred embodiment, the buffer containing the recently decompressed data need be no larger than the size of the history buffer in the compressor. Since the pointer is incapable of indicating the location of a sequence further away, no recently decompressed data beyond that need be retained.

Figure 10:
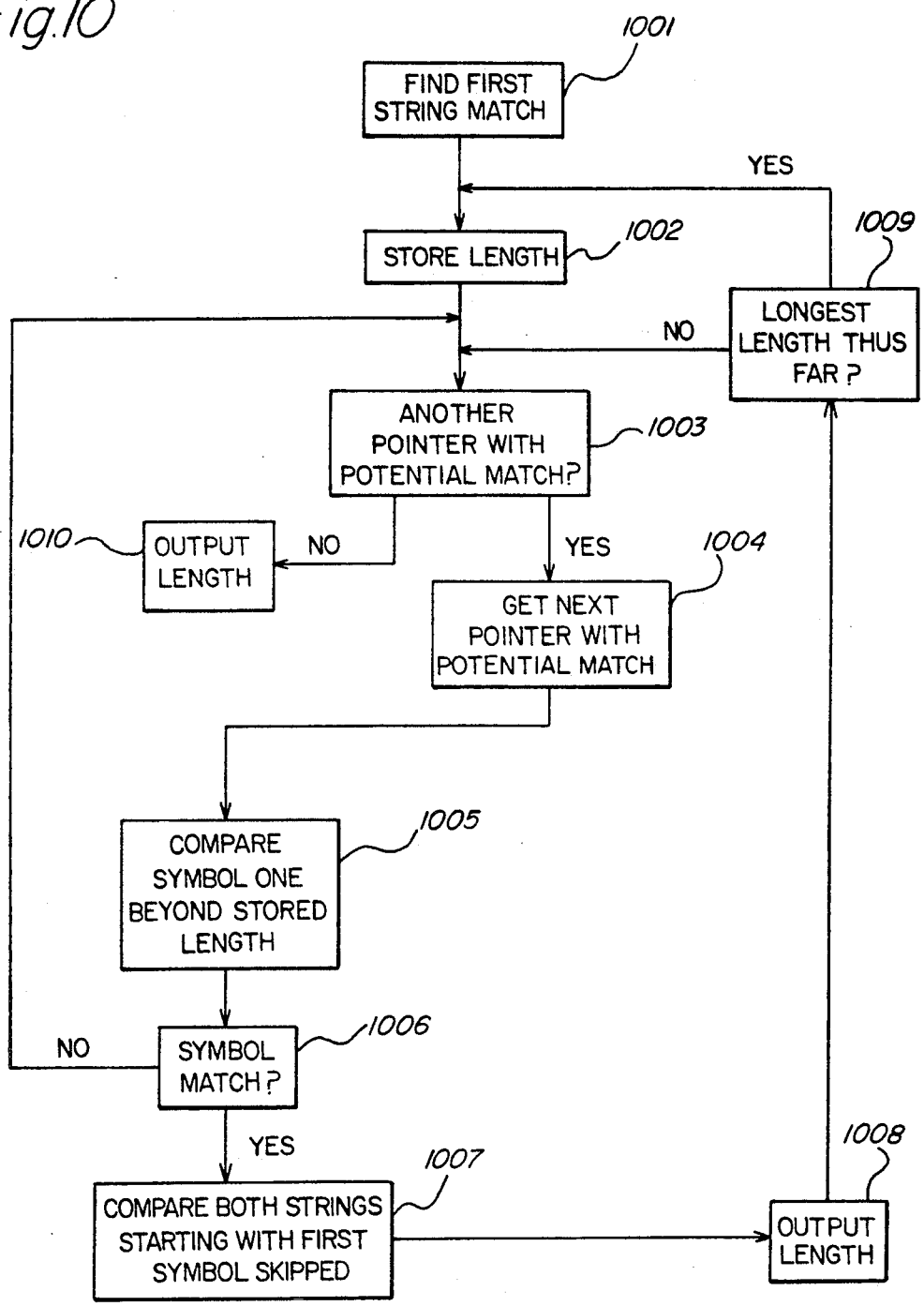
FIG. 10 is a flow chart of an alternate embodiment string comparison method of the present invention.

In an alternate embodiment of the present invention steps 733 and 735 are carried out by comparing a symbol in the history buffer substring with a symbol in the lookahead buffer substring starting with a symbol which is one symbol beyond the longest length match found thus far, as described above. This alternate embodiment method is illustrated in FIG. 10. As illustrated, the first step 1001 in the process is to find a first string match. After step 1001 the length of this match is stored in step 1002. In step 1003 it is asked whether there is a next pointer with a potential match. If the answer in step 1003 is yes, then in step 1004 the next pointer potential match is retrieved. If the answer is no then the length is outputted in step 1005 and a longest length match is found. Proceeding from step 1004, in step 1005 the symbol one beyond the stored length of the history substring 113 is compared with the look ahead substring 111. By this step of comparing, a number of symbols equal to the stored length have been "skipped" and not compared. Step 1006 asks if there is a match of this symbol. If there is not a match of this symbol then the routine proceeds to step 1003 where it asks if there is a next pointer and the procedure repeats. If there is a match of this symbol in step 1006 then in step 1007, sequential symbols, starting from the first symbol in the history substring 113 and look ahead substring 111 are compared until a symbol is found which does not match. Then this length is outputted in step 1008. In step 1009, it is asked whether this length is the longest length match found thus far. If so, then a longer string match is found and the routine proceeds to step 1002 and this new longer length is stored. If this length is not the longest found, then the routine proceeds to step 1003 where it asks if there is a next pointer potential match. In this alternate embodiment method of finding the longest length match in the history substring 113, a great deal of time is saved by starting a symbol comparison with one symbol beyond the current longest length match found thus far. In this way, if this one symbol does not match, no time is wasted on comparing the skipped symbols.

Figure 11:
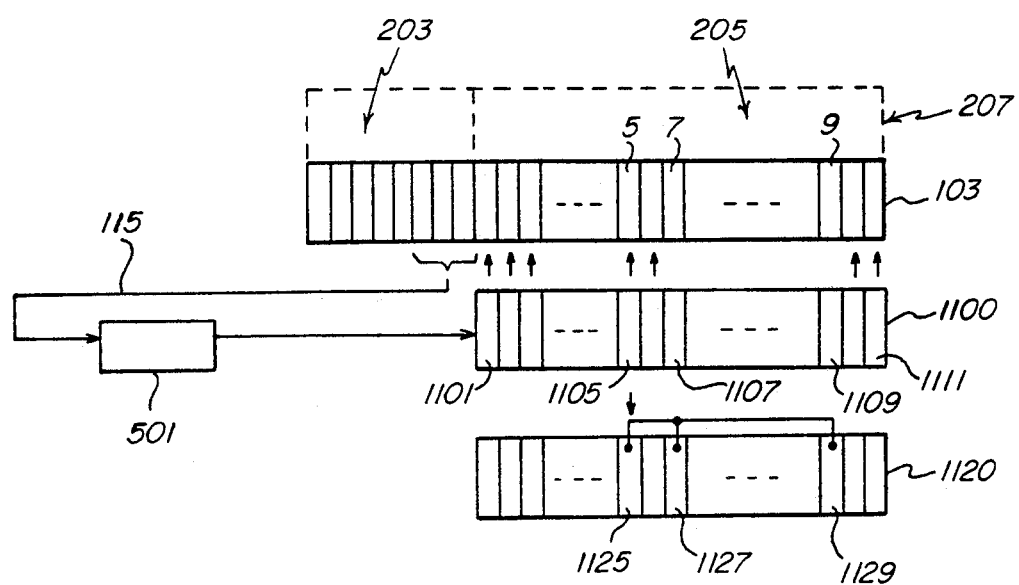
FIG. 11 is a detailed block diagram of an alternate embodiment hashing subsystem of the present invention.

FIG. 11 illustrates a detailed block diagram of an alternate embodiment hashing subsystem of the present invention. As illustrated, processing window 207 includes look ahead buffer 203 and history buffer 205 encompassing memory 103. Additionally, hash table 1100 is a single dimensional hash table being of a length (# of entries) which depends upon the number of entries which the hashing function can produce. This on dimensional hash table 1100 is contrasted with the two dimensional hash table 503, illustrated in FIG. 5, of the preferred embodiment of the present invention. Like hash table 503, hash table 1100 is a FIFO hash table. Hash table 1100 includes a pointer to the most recent potential match location in the history buffer 205 portion of memory 103. As with the two-dimensional array hash table 503 of the preferred embodiment of the present invention, in response to the input of a prefix substring 115, hash computer 501 and hash table 1100 cooperate to produce a pointer in each location of hash table 1100. In addition, link list 1120, being of the same length as the history buffer, includes the list of pointers in hash table 1100, each pointer which has a corresponding same hash value being linked. For example, assuming locations 5, 7 and 9 in history buffer 205 have the same hash value, pointer 1105 would point to the most recent of these locations, that being location 5. In addition, pointer 1105 would point to link list 1120 and link list 1120 would link these three pointers 1105, 1107 and 1109 together. As illustrated in link list 1120 locations 1125, 1127 and 1129 are linked together, which correspond to pointers 1105, 1107, and 1109 respectively. In this manner, when history buffer substrings are compared with look ahead buffer substrings, each of the potential matched history buffer substrings are found by indexing the linked pointers in the link list 1120. Because the link list 1120 is the same length as history buffer 205, each and every potential matched substring in the history buffer 205 can be looked at. This is an alternative to the preferred embodiment two-dimensional array structure hash table in which only a limited number of recent potential matches are pointed to and can be looked at. It is noted that, in this alternate embodiment a counter may be maintained for controlling the number of potential matches looked at, in a time saving effort, as will be described.

The link list 1120 is generated in the following way. When a hash value is computed and is being entered to the first position 1101 in the hash table, a pointer at another position in the table 1100 which has a corresponding matched hash value is copied into that first position 1101. In accordance with the link list 1120 of the present invention every position will know every other position which points to it and every position will know which position(s) it points to. It is to be appreciated that the link list 1120 and hash table 1100 are of a finite length. In one embodiment, a circular shift register is used and last position of the hash table 1100 and link list 1120 are overwritten by the first position. Thus, for example, when the last position in hash table 1100, that being position 1111, is overwritten by the first position, that being 1101, any pointer to position 1111, as stored in the link list 1120, should then point to null. As such, a null would replace this last position pointed to. In this manner, the link list 1120 and hash table 1100 are maintained accurately. It is to be appreciated that another hardware element than a circular shift register is envisioned for use as the link list, or a software routine.

Figure 12A:
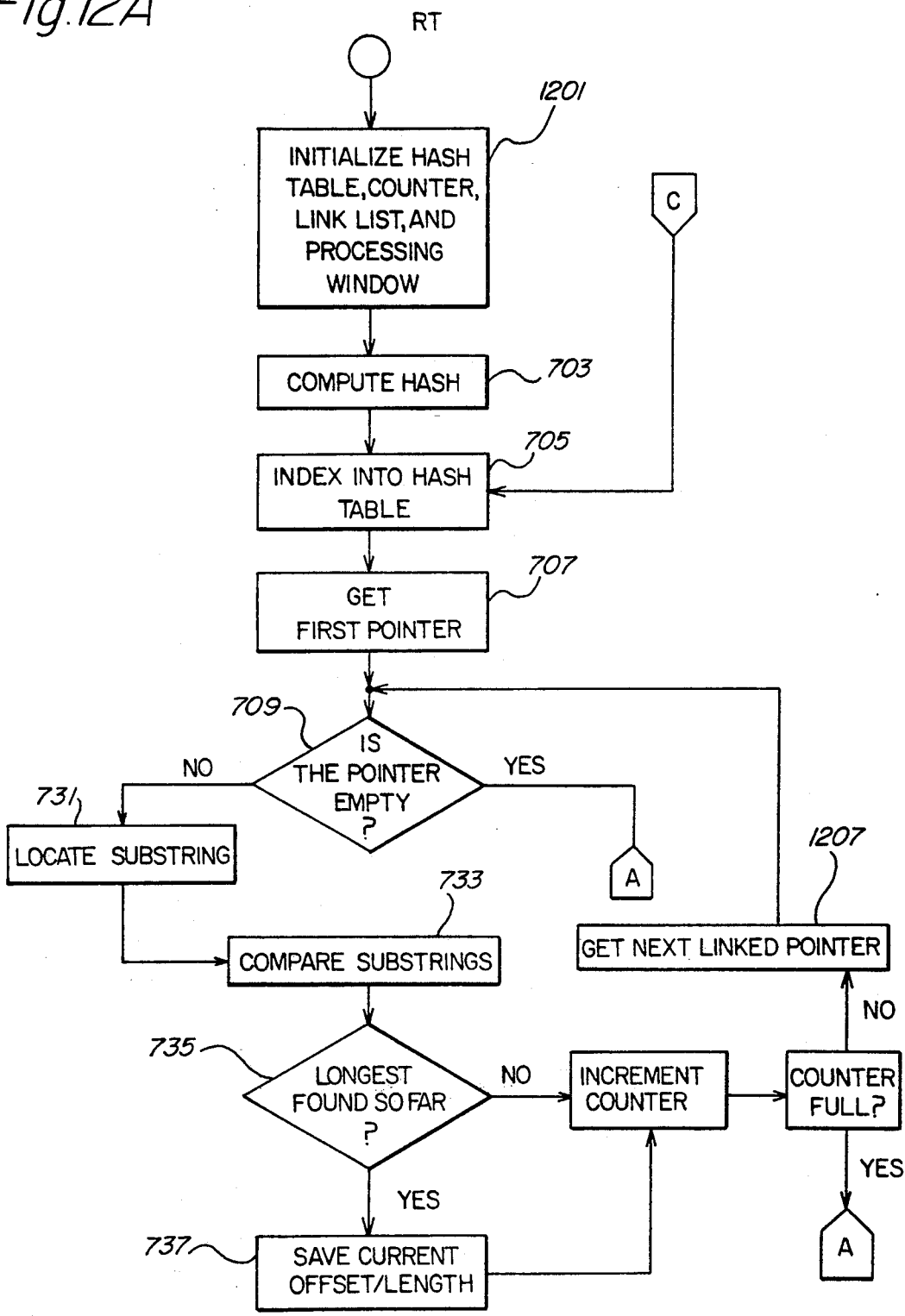
FIGS. 12a, b, and c are a flow chart of an alternate embodiment compression method of the present invention.
Figure 12B:
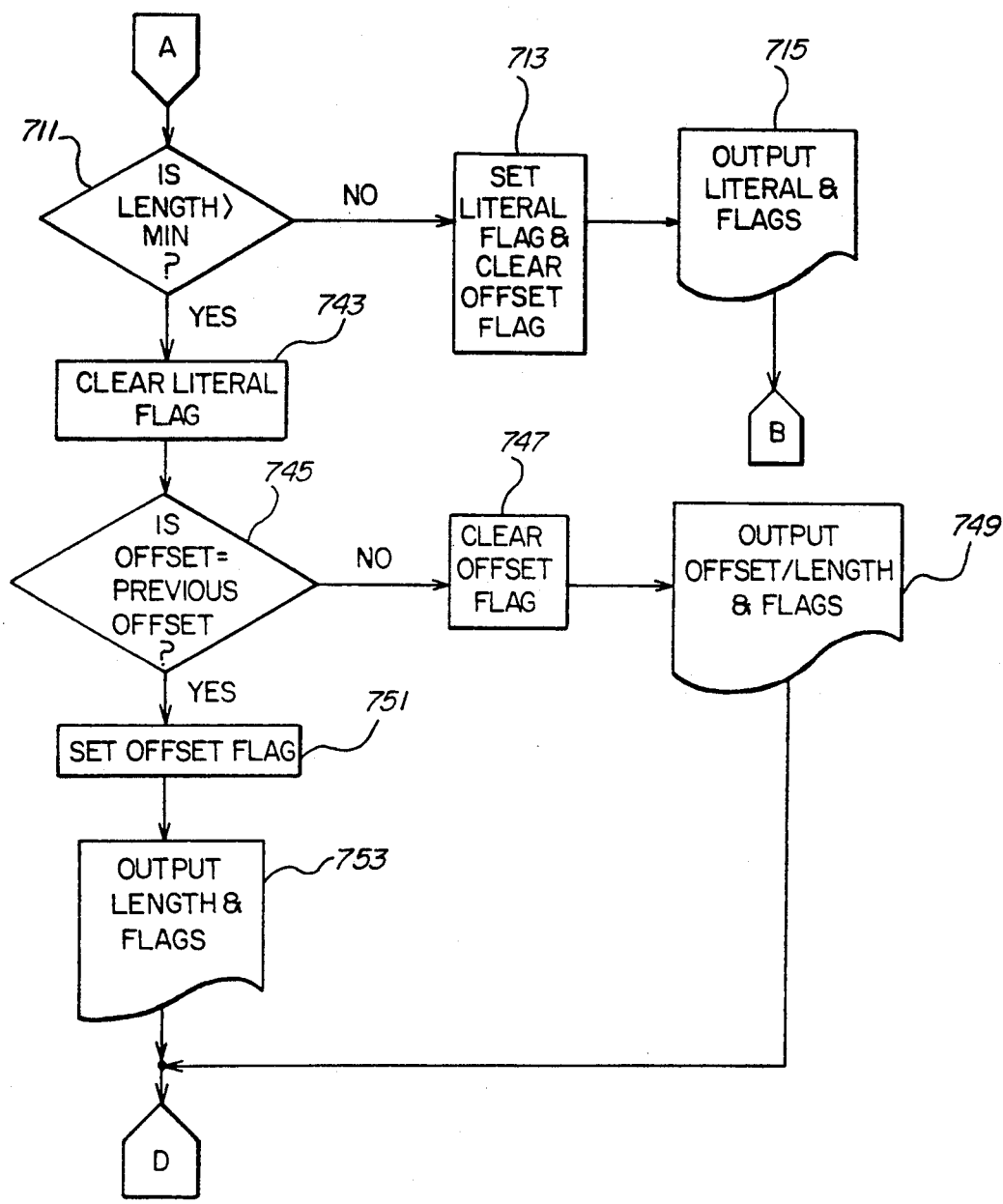
Figure 12C:
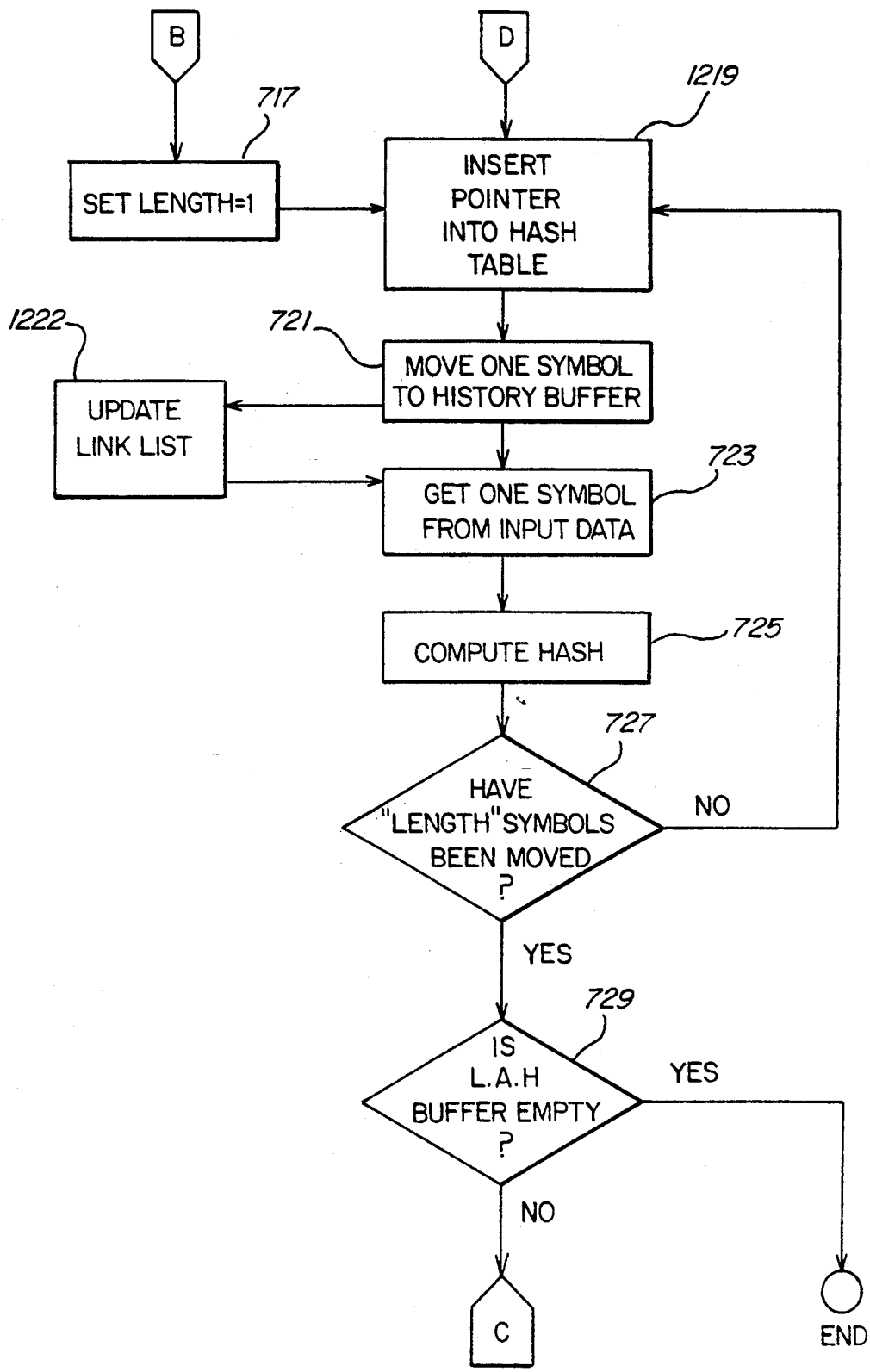

Referring now to FIGS. 12A, 12B, and 12C, the operation for data compression according to this alternate embodiment with the link list of the present invention is illustrated. It is to be appreciated that most of the steps in this alternate embodiment method are the same as those described with reference to FIGS. 7A, 7B and 7C of the preferred embodiment. Those with identical reference characters operate in the same manner. Referring now to FIG. 12A in step 1201, the hash table counter, link list and processing window are initialized. The routine then proceeds iteratively through steps 703, 705, 707, 709, 733, and 735 as described with reference to FIGS. 7A, 7B and 7C. Step 735 asks if the matched substring is the longest match found so far. If it is the longest match found so far the counter is incremented in step 1203. Then it is asked whether the counter is full in step 1205. If the counter is full the routine proceeds to step 711 as illustrated in FIG. 12B. If the counter is not full then the routine proceeds to step 1207 in which the next linked pointer is retrieved. This process then continues until the longest matched string is found. It is to be appreciated that the counter limits the number of history buffer strings that will be searched. When a lot of redundancy appears in the data to be processed, much time can be spent comparing strings in search for a longer length match which doesn't exist. With the counter of the present invention, however, this problem is avoided. FIG. 12B is the same as FIG. 7B, as described above. Referring now to FIG. 12C, at point D in FIG. 12C, step 1219 inserts the pointer substring into the hash table. This then proceeds to step 721 which moves one symbol to the history buffer. In step 1222 the link list is updated. Then in step 723 one symbol is retrieved from the input data and the hash is computed in step 725. A difference between this embodiment of the method, as illustrated in FIG. 12C, from the embodiment of the method as illustrated in FIG. 7C, is that, in this embodiment, a link list is maintained which links together all pointers to locations with the same hash value and updated with a one dimensional hash table which points to each location in the history buffer. This is contrasted with the embodiment of the method illustrated in FIG. 76 in which a two-dimensional hash table is maintained with limited pointers to locations in the history buffer, and each entry is a collision chain.

Various extensions and variations contemplated by this invention will now be apparent to those skilled in the art. These may include extensions for use of this method in modems, mass storage devices, and other applications. Choices of parameters such as the sizes of the lookahead or history buffers, or the number of entries in the collision chains to optimize performance in a particular application will be readily apparent to those skilled in the art.

What I claim is:

1. A system for processing digital input data, said input data being divisible into strings of bits representing symbols, comprising:
   a memory for holding at least first and second strings of symbols from said input data, said first string having a prefix substring of a fixed length;
   means for receiving said prefix substring and computing a first string hash value therefrom;
   a hash table for receiving said first string hash value and providing one pointer to each of a number of locations in said second string having an associated second string substring of said fixed length with a second string hash value which matches said first string hash value;
   means for receiving said first and second strings of symbols from said memory;
   means for determining the longest second string substring match of a first string substring including said first string prefix substring, said means for determining including means for finding a second string substring match of a certain length pointed to by a first pointer, and means for performing a symbol comparison of said first string substring with a second string substring pointed to by a second pointer, beginning with a symbol being at least one symbol beyond said certain length; and
   means for generating compressed output data responsive to said means for determining.

2. A system as claimed in claim 1 further including a link list for storing accessible pointer information, said information including a link between every pointer which points to a location having the same associated second string hash value.

3. A system as claimed in claim 1, wherein said memory further comprises:
   a first buffer for holding said first string; and
   a second buffer for holding at least one said second string.

4. A system as claimed in claim 1 wherein said compressed output data includes:
   at least one of:
      a pointer to one of said locations in said second string and
      a partial pointer to one of said locations in said second string;
   a first symbol corresponding to said location; and
   a flag for identifying which of said pointer or partial pointer is included.

5. A system as claimed in claim 4 wherein said means for generating compressed output data comprises:
   means for selecting at least one of said pointer and said partial pointer; and
   means for generating said flag.

6. A system as claimed in claim 5, further including:
   means for receiving said compressed output data; and
   means for decompressing said compressed output data received; wherein said means for decompressing said compressed output data comprises:
   means for decoding said flag, and
   means responsive to said means for decoding said flag, for translating said at least one of said pointer and said partial pointer into a decompressed data sequence identical to said input data.

7. A system as claimed in claim 6, wherein said means for translating comprises:
   a memory for receiving sequences of decompressed data; and
   means for identifying in said memory for receiving decompressed data sequences pointed to by said pointers and said partial pointers; and
   means for copying said sequences identified by said means for identifying to new locations in said memory.

8. A system as claimed in claim 4, wherein said pointer comprises:
   an offset for identifying said first symbol; and
   a length over which said first string substring and a second string substring match.

9. A system as claimed in claim 4, wherein said partial pointer comprises:
   a length over which said first string substring and a second string substring match.

10. A system for processing digital input data, said input data being divisible into strings of bits representing symbols, comprising:
    a memory for holding at least first and second strings of symbols from said input data, said first string having a prefix substring of a fixed length;
    means for receiving said prefix substring and computing a first string hash value therefrom;
    a hash table for receiving said first string hash value and providing a pointer to a location in said second string having an associated second string substring of said fixed length with the same hash value;
    a link list including a link between each pointer which points to a location having an associated second string substring of said fixed length with a same second string hash value;
    means for receiving said first and second strings of symbols from said memory;

means for determining the longest second string substring match of a first string substring including said first string prefix substring, said means for determining including means for comparing said first string substring with a selected limited number of second string substrings, a fixed length of which has a same hash value as that of said first string hash value; and means for generating compressed output data responsive to said means for determining.

11. A system as claimed in claim 10 wherein said means for determining further includes:

means for finding a second string substring match of a certain length pointed to by a first pointer; and means for performing a symbol comparison of said first string substring with a second string substring pointed to by a second pointer, said means for performing beginning with a symbol being at least one symbol beyond said certain length.

12. A system as claimed in claim 10, wherein said memory further comprises:

a first buffer for holding said first string; and a second buffer for holding at least one said second string.

13. A system as claimed in claim 10 wherein said compressed output data includes:

at least one of:

a pointer to one of said locations in said second string and a partial pointer to one of said locations in said second string;

a first symbol corresponding to said location; and a flag for identifying which of said pointer or partial pointer is included.

14. A system as claimed in claim 13 wherein said means for generating compressed output data comprises:

means for selecting at least one of said pointer and said partial pointer; and means for generating said flag.

15. A system as claimed in claim 14 further including:

means for receiving said compressed output data; and means for decompressing said compressed output data received, wherein said means for decompressing said compressed output data comprises:

means for decoding said flag; and means responsive to said means for decoding said flag, for translating said at least one of said pointer and said partial pointer into a decompressed data sequence identical to said input data.

16. A system as claimed in claim 15, wherein said means for translating comprises:

a memory for receiving sequences of decompressed data; and means for identifying in said memory for receiving decompressed data sequences pointed to by said pointers and said partial pointers; and means for copying said sequences identified by said means for identifying to new locations in said memory.

17. A system as claimed in claim 13, wherein said pointer comprises:

an offset for identifying said first symbol; and a length over which said first string substring and a second string substring match.

18. A system as claimed in claim 13, wherein said partial pointer comprises:

a length over which said first string substring and a second string substring match.

19. A method for processing digital input data, said input data being divisible into symbols, comprising the steps of:

receiving input data, including a first string having a prefix substring of a fixed length being less than a length of said first string;

computing a hash value of said prefix substring;

storing pointers in a hash table to each location in a second string;

generating a link list for linking pointers together in said hash table which point to locations having fixed lengths which have a same hash value;

comparing said first string with a selected limited number of substrings in said second string having linked pointers and fixed length hash values which match that of said prefix substring hash value; and generating compressed output data based upon said comparison.

20. A system as claimed in claim 19 wherein said step of comparing includes:

locating a second string substring match of a certain length pointed to by a first pointer; and performing a symbol comparison of said first-string with a second string substring pointed to by a second pointer, beginning with a symbol being one symbol beyond said certain length.

21. A system as claimed in claim 20 wherein the step of generating comprises the steps of:

outputting at least one of a pointer to a location in said second string and a partial pointer to a location in said second string;

outputting a first symbol corresponding to said location; and outputting a flag for identifying which of said pointer or partial pointer is outputted.

22. A system as claimed in claim 20 further comprising the step of:

decompressing said compressed output data.

* * * * *